United States Patent
Kanakasabapathy et al.

(10) Patent No.: US 9,209,178 B2
(45) Date of Patent: Dec. 8, 2015

(54) FINFET ISOLATION BY SELECTIVE CYCLIC ETCH

(71) Applicant: International Business Machines Corporation, Armonk, NY (US)

(72) Inventors: Sivananda K. Kanakasabapathy, Niskayuna, NY (US); Stuart A. Sieg, Albany, NY (US); Theodorus E. Standaert, Clifton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/088,903

(22) Filed: Nov. 25, 2013

(65) Prior Publication Data

US 2015/0145065 A1 May 28, 2015

(51) Int. Cl.
*H01L 21/8234* (2006.01)
*H01L 21/762* (2006.01)
*H01L 27/088* (2006.01)

(52) U.S. Cl.
CPC ...... *H01L 27/0886* (2013.01); *H01L 21/76224* (2013.01); *H01L 21/823431* (2013.01); *H01L 21/823481* (2013.01)

(58) Field of Classification Search
CPC ....... H01L 21/76; H01L 29/785; H01L 29/16; H01L 21/762; H01L 21/30604; H01L 21/3065; H01L 21/308; H01L 21/823431; H01L 21/823821; H01L 27/0886; H01L 21/76224; H01L 21/823481; H01L 29/0649; H01L 21/845; H01L 27/1211; H01L 29/945
See application file for complete search history.

(56) References Cited

U.S. PATENT DOCUMENTS

| | | | |
|---|---|---|---|
| 6,872,644 B1 | 3/2005 | Buynoski et al. | |
| 8,617,996 B1 * | 12/2013 | Chi et al. | 438/700 |
| 8,753,940 B1 * | 6/2014 | Wei et al. | 438/283 |
| 8,829,617 B2 * | 9/2014 | Haran et al. | 257/347 |
| 8,928,057 B2 * | 1/2015 | Cote et al. | 257/301 |
| 2001/0021581 A1 | 9/2001 | Moon et al. | |
| 2005/0170593 A1 | 8/2005 | Kang et al. | |
| 2008/0081431 A1 * | 4/2008 | Roh et al. | 438/397 |
| 2009/0321834 A1 * | 12/2009 | Rachmady et al. | 257/365 |
| 2010/0047995 A1 * | 2/2010 | Apodaca et al. | 438/429 |

(Continued)

FOREIGN PATENT DOCUMENTS

| | | |
|---|---|---|
| JP | 04354331 A | 12/1992 |
| JP | 06-260452 | 9/1994 |

(Continued)

*Primary Examiner* — Jarrett Stark
*Assistant Examiner* — Bitew Dinke
(74) *Attorney, Agent, or Firm* — Whitham Curtis Christofferson & Cook, PC (57) ABSTRACT

Etching interleaved structures of semiconductor material forming fins of finFETs and local isolation material interposed between the fins is performed alternately and cyclically by alternating etchants cyclically such as by alternating gases during reactive ion etching. Etchants are preferably alternated when one of the semiconductor material and the local isolation material protrudes above the other by a predetermined distance. Since protruding surfaces are etched more rapidly than recessed surfaces, the overall etching process is accelerated and completed in less time such that erosion of other materials to which the etchants are less than optimally selective is reduced and allow improved etching of trenches for improved isolation structures to be formed.

11 Claims, 12 Drawing Sheets

(56) References Cited

U.S. PATENT DOCUMENTS

| | | |
|---|---|---|
| 2011/0045648 A1 | 2/2011 | Knorr et al. |
| 2011/0260282 A1 | 10/2011 | Kawasaki |
| 2012/0049294 A1* | 3/2012 | Chen et al. .................. 257/401 |
| 2013/0065326 A1* | 3/2013 | Sudo ............................ 438/3 |
| 2013/0089958 A1 | 4/2013 | Yeh et al. |
| 2013/0244387 A1* | 9/2013 | Cho ............................. 438/283 |
| 2013/0309838 A1* | 11/2013 | Wei et al. .................... 438/424 |
| 2013/0330889 A1* | 12/2013 | Yin et al. .................... 438/197 |
| 2014/0001562 A1* | 1/2014 | Liaw ........................... 257/369 |
| 2014/0004682 A1* | 1/2014 | Yuan et al. .................. 438/424 |
| 2014/0061807 A1* | 3/2014 | Deng et al. .................. 257/368 |
| 2014/0145250 A1* | 5/2014 | Cheng et al. ................ 257/289 |
| 2014/0159126 A1* | 6/2014 | Wei et al. .................... 257/288 |

FOREIGN PATENT DOCUMENTS

| | | | |
|---|---|---|---|
| JP | 04-354331 | 8/2009 | |
| WO | WO 2004102642 A2 * | 11/2004 | ............ H01L 21/00 |
| WO | WO 2007031778 A1 * | 3/2007 | ......... H01L 21/3065 |

\* cited by examiner

FINFET ISOLATION BY SELECTIVE CYCLIC ETCH

FIELD OF THE INVENTION

The present invention generally relates to semiconductor integrated circuit devices including finFETs and, more particularly, to finFETs and isolation structures formed between them at very small minimum feature size regimes and extremely high integration density.

BACKGROUND OF THE INVENTION

The desire for increasingly high performance of integrated circuits has driven integrated circuit designs to very high integration densities and extremely small device sizes. High integration density requiring minimization of the area occupied by each device not only increases the functionality that can be provided on a chip of a given size but reduced connection lengths between devices on an integrated circuit that reduces signal propagation time (increasing potential clock speed) and increases immunity to noise. However, scaling of traditional designs of devices such as field-effect transistors can compromise electrical characteristics such as control of the depletion layer in the transistor channel reducing the ratio of resistance in conductive and non-conductive states. The principal reason for compromise of depletion layer control is that reduced gate voltages necessary to reduce power dissipation requirements are unable to control the charge carrier population at increasing distance from the gate electrode and at corners of the conduction channel, even when the gate insulator is made very thin and when high dielectric constant (Hi-K) materials are used for the gate insulator.

To recover an adequate level of control of the depletion layer, so-called finFET transistor designs have been developed and increasing use of finFETs in integrated circuits is foreseeable. FinFETs are characterized by being formed with a thin, fin-shaped body of semiconductor material providing the source and drain regions with a conduction channel between them formed on an insulating surface allowing the transistor gate to be formed at least on opposing sides of the thin fin. The fin is often formed to have a width that is thinner than can be resolved lithographically to reduce the distance of any location in the fin from one of the gate electrode portions.

Several techniques of fabricating finFETs are known in the art, including so-called sidewall image transfer (SIT) which is capable of forming the fins with transverse dimensions smaller than can be resolved lithographically, sometimes referred to as sub-lithographic features. Sidewall image transfer involves forming a mandrel, forming sidewalls on the mandrel, removing the mandrel and removing portions of the remaining sidewalls that do not correspond to the desired fins and then using the remaining sidewall portions as a hard mask to form the fins. Therefore, SIT techniques are complex and include relatively critical processes with critical process tolerance windows and generally form many more fins in greater proximity than is desired in the completed integrated circuit.

A simpler fabrication technique, although requiring a comparable number of processes, is referred to as split-pitch lithography. Split-pitch lithography is based on the fact that, at feature sizes near the lithographic resolution limit and where features must be formed in close proximity to each other, the interference patterns caused by diffraction of lithographic exposure energy become critical since peaks in the intensity of the interference pattern can partially expose the resist (in which exposure is cumulative). Therefore, split-pitch lithography makes a resist exposure for patterning a hard mask using exposure masks with widely separated features and obtains proximity of features by replacing the resist and making another resist exposure using a different or offset mask after each respective pattern of widely spaced features is transferred to the hard mask; thus accumulating closely spaced features in the hard mask which is used to pattern the underlying layer(s) of material. As applied to fabrication of finFETs, however, split-pitch techniques also develop many more fins than needed and with closer proximity to each other than is desired which cause problems of fin removal and formation of isolation structures. Namely, removal of unwanted fin portions require additional masking to remove unwanted fins and fin portions regardless of the technique used to produce the fins.

This additional masking produces a structure in which the surface exposes the edges of thin, alternating regions of semiconductor (e.g. silicon) and a semiconductor oxide isolation regions (e.g. silicon oxide). Areas of this surface which are to be removed have a width several times that a fin and a relatively deep recess formed in underlying semiconductor material to form an isolation structure without excessively eroding a (preferably nitride) cap on the fin used for isolation structure etching.

SUMMARY OF THE INVENTION

It is therefore an object of the present invention to provide an etching process for semiconductor material and semiconductor oxide of increased selectivity to etching of semiconductor nitride or other materials suitable for use as a hard mask such as silicon carbide and silicon oxynitride.

It is another object of the invention to provide a robust etching process for reliably removing excess fins resulting from split pitch lithography or sidewall image transfer (SIT) processes or other processes for forming finFETs to provide suitably sized recesses for isolation structures which is compatible with processes that do not compromise uniformity of fin dimensions or significantly erode a hard mask used to define isolation structure locations while providing good control of critical dimensions (CD) and line edge roughness (LER).

In order to accomplish these and other objects of the invention, a method for forming a trench for an isolation structure from a structure including excess fins formed from a layer of semiconductor material with local isolation material deposited between said fins is provided comprising steps of depositing hard mask material over the local isolation material and the fins, patterning the hard mask material, and cyclically etching the fins selectively to the hard mask material and the local isolation material alternatingly with etching the local isolation material selectively to the fins and the hard mask material.

In accordance with another aspect of the invention, a semiconductor integrated circuit comprising a plurality of finFETs, a plurality of local isolation structures interposed between two finFETs which are separated by a first distance, and, at least one isolation structure interposed between two finFETs which are separated by a second distance greater than the first distance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
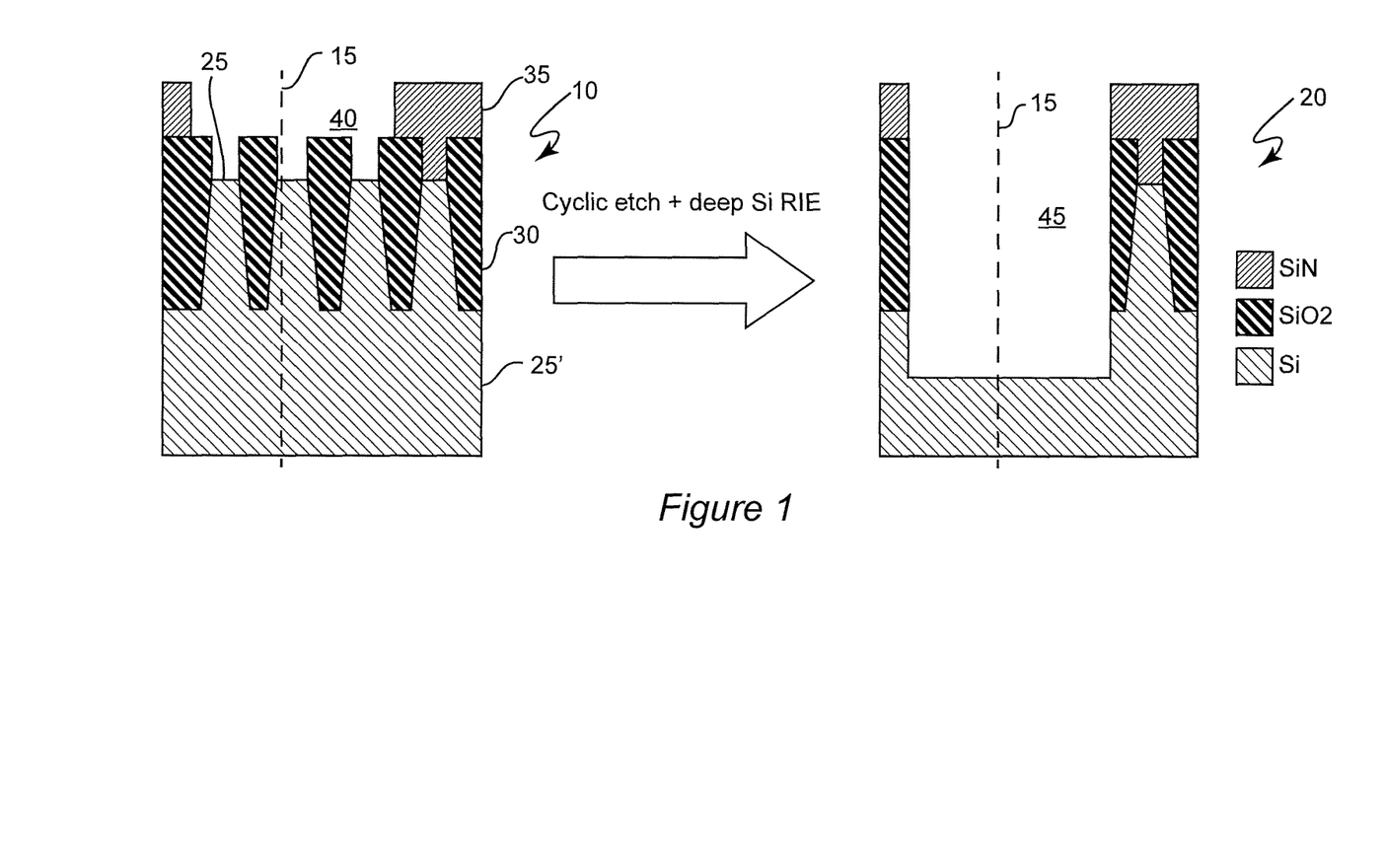
FIG. 1 is a cross-sectional view of a region of a semiconductor wafer that will include a single fin for a finFET and an isolation structure that may be useful for conveying an understanding of the problem addressed by the invention.

Referring now to the drawings, and more particularly to FIG. 1, two cross-sectional views of a portion of a semiconductor wafer are shown at an intermediate stage in the formation of a plurality of finFETs in an integrated circuit. It should be understood that the portion of the wafer shown in each cross-sectional view represents only the space required for a single finFET and its associated isolation structure. It should also be understood that these cross-sectional views and other cross-sectional views of FIGS. 7-12 which will be described below are not taken along a single straight line but represent a view in which different portions of the section which meet at the approximate location indicated by dashed line 15 are taken in two orthogonal directions as will be fully explained below with reference to FIGS. 2A-4C.

The cross-sectional view 10 on the left represents an intermediate fabrication stage resulting from sidewall image transfer or split pitch lithography processing; the former being preferred for fins having a width smaller than can be resolved lithographically and the latter being preferred for finFETs having a fin width close to the limits of a lithographic exposure and etch process. Both types of processes effectively use a hard mask. A slight taper in the cross-section of the fins, as illustrated, is desired and produced because of the depth of the etch causing loading of the etchant with etched material (thus effectively diluting the etchant) even though the etch processes are preferably highly anisotropic. As alluded to above, both processes form a number of fin-like structures in much greater number and proximity to each other than is desirable and far in excess of the number of finFETs to be fabricated. The structures resulting from such process also form structures having portions that are not desirable in the completed fins. For example, sidewall structures formed on mandrels in the course of SIT processing will be closed geometric shapes that must have the ends and possibly one side removed to separate the remaining sidewall portions into a substantially linear pattern or patterns.

It should be noted that the fins are formed from a semiconductor body that may be bulk semiconductor or the active layer of a semiconductor on insulator (SOI) wafer. (It should also be noted that, while the invention will be described in the context of silicon fins, silicon oxide insulation and silicon nitride caps and hard masks in which the problem addressed by the invention is very severe, the invention is applicable to other combinations of materials appropriate to such respective materials where a similar problem may be presented to some degree.) A previous fabrication method producing finFETs having a greater fin width than those to which the invention is preferably directed formed finFETs from a layer of semiconductor material formed on a surface of an insulator layer by, for example, etching entirely through the active semiconductor layer of a SOI wafer. In such structures, isolation was provided by the insulator layer, itself, and additional isolation structures were not generally required. In contrast therewith, at high integration densities and extreme scaling of finFET dimensions as shown in FIG. 1, the fins 25 are formed by etching deeply into but not through the semiconductor material 25' such that the fins are integral with the semiconductor material. Local isolation and mechanical support for the fins is provided by oxide fill 30 between the fins which is preferably deposited, planarized to the top of the fins and the fins etched back prior to deposition of a nitride or other material layer that will serve as both a hard mask for the trench etch and caps on the remaining fins.

In such a case, the remaining semiconductor material below the level of the base (e.g. the location in the fin most remote from the surface from which etching is performed) of the fins must be deeply etched in order to isolate finFETs from each other at least to a depth within the semiconductor material where leakage conduction between fins through the semiconductor material is negligible or at least tolerable. The depth of the required etch to form a trench 45 for the isolation structure in accordance with pattern 40 in a nitride layer 35, preferably much in the nature of shallow trench isolation, thus becomes very critical to the successful manufacture with high yield of integrated circuits containing finFETs.

Moreover, particularly as applied to finFETs formed of silicon, as is often preferred and to which the invention is particularly applicable, the extended etch process needed to achieve sufficient depth is also particularly critical since the etch chemistries for etching silicon oxide and silicon nitride, the preferred material for the hard mask for etching isolation structure areas, are relatively similar and not as selective to each other as may be required for an etch sufficient to achieve the required etch depth as is illustrated at 20 on the right side of FIG. 1 without excessive erosion of the nitride cap. Prior to the present invention, other etching processes, and reactive ion etch (RIE) processes in particular, applied to such a structure for forming a deep recess for an isolation structure not only caused excessive and unacceptable erosion of the nitride cap but also compromised control of critical dimensions and line edge roughness. Therefore, prior to the present invention it was not known whether any etch process could be found that could perform the needed etch process to achieve the required result illustrated in FIG. 1 particularly by a RIE process as is preferred for providing a high degree of anisotropy needed for long duration deep etching. That is, essentially, what is needed is a process to form a well-defined rectangular trench in different, adjacent materials which tend to cause the shape to be irregular and non-ideal while accommodating the requirement of selectivity of the etch to nitride.

The combination of these requirements eliminates all known options for developing optimum geometrical regularity of the trench.

In this regard, while the invention is applicable to any semiconductor material and oxides and nitrides thereof, particularly where etch chemistries may be somewhat similar or less selective to each other than may be necessary, the effects of the invention are particularly useful and beneficial when used with silicon and oxides and nitrides thereof. Therefore, the following description of the invention will be generally directed to the application of the invention to silicon finFETs but it is to be understood that the invention is also applicable to finFETs of other semiconductor materials and "silicon" and "semiconductor material" should be regarded as synonymous except where the context clearly indicates otherwise.

Figure 2A:
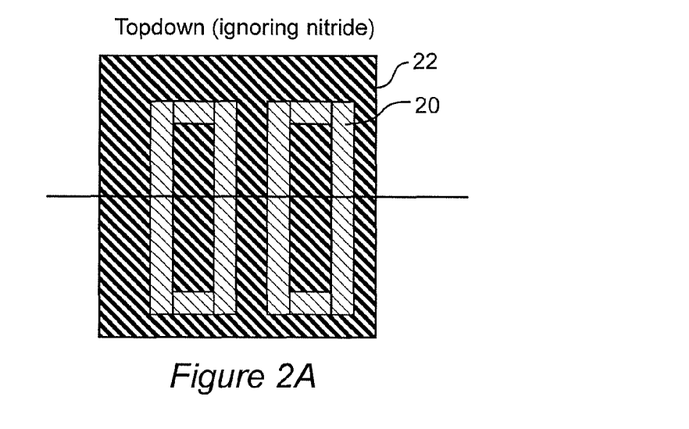
FIGS. 2A, 2B, 2C, 3A, 3B, 4A, 4B and 4C are plan and cross-sectional views of a region of a semiconductor wafer useful for understanding of developing a hard mask pattern suitable for excess fin removal with highly uniform fin geometry.

Referring now to FIGS. 2A-4C the section corresponding to the cross-sectional views of FIGS. 1 and 7-12 will now be explained. These Figures illustrate stages of integrated circuit fabrication prior to that shown in FIG. 1. Dimensions of plan views in these Figures do not correspond closely with the proportions of finFET fins but are chosen to convey the basic principles of the use of two differing masks, one with positive pattern shapes and the other with negative pattern shapes, to form fins of at least initially uniform geometry and substantially uniform electrical characteristics. FIGS. 2A and 2B are plan views of an area of a semiconductor wafer which will include several finFETs and corresponding isolation structure(s). FIG. 2A shows two raised, closed geometric patterns 20 such as may be formed by either STI or split-pitch lithography processes etching into the silicon or semiconductor of the wafer to recess areas not included in these closed shapes. The recessed areas are then filled with oxide 22 to provide isolation and mechanical support of the raised patterns 20 and, eventually, the fins which are relatively tall (e.g. initially somewhat over 100 nm) and have a large height to width aspect ratio. The oxide fill is preferably formed by depositing a blanket layer of oxide and then planarizing the oxide to the tops of the fins. The tops of the fins are then recessed slightly below the surface of the oxide to a preferable fin height of approximately 100 nm and a blanket layer of nitride is deposited as shown in FIG. 2B. The cross-section of the resulting structure is illustrated in FIG. 2C.

Figure 3A:
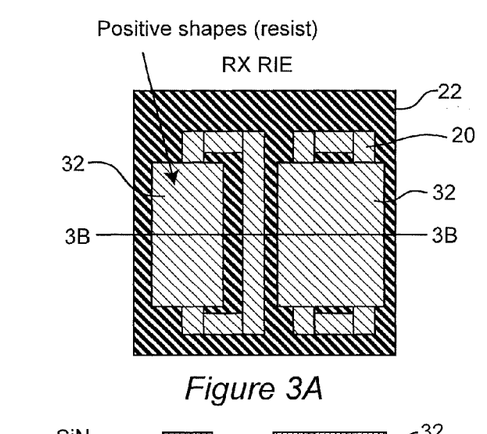
Figure 3B:
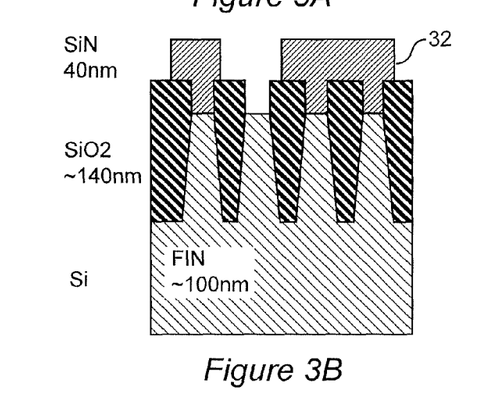

Referring now to FIG. 3A, nitride layer 24 is patterned using a first mask to expose a resist (preferably formed over a thick organic planarization layer (OPL) and an anti-reflection coating (ARC)) to form positive shapes 32. The corresponding cross-section indicated at 3B-3B of FIG. 3A is shown in FIG. 3B. It should be noted that the patterning of the nitride is similar to that shown in FIG. 1 although proportionally too small, as illustrated for a suitable isolation structure or removal of a plurality of adjacent fins. All resist and/or anti-reflection coating (ARC), if used is consumed by the etch process described above. If a Si-ARC material is used, any resist remaining on the nitride is then removed and a new blanket of resist applied.

Figures 4A, 4B, 4C:
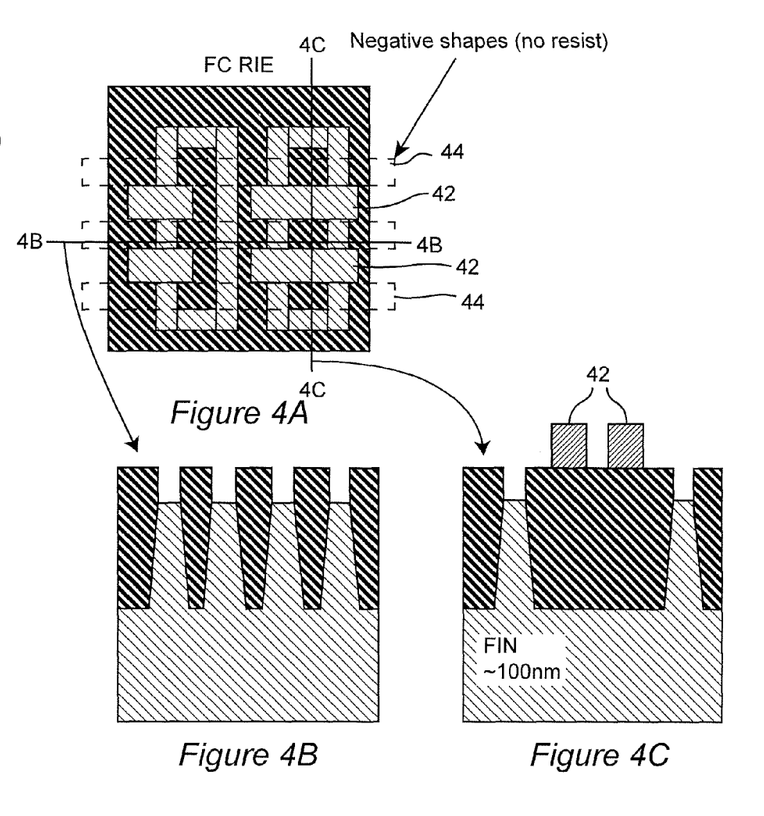

The new layer of resist (preferably formed over a thick organic planarization layer (OPL) and an anti-reflection coating (ARC) is then patterned using a second mask to form openings or negative shapes 40, indicated by dashed lines and the remaining portion of the nitride layer is again etched to further pattern positive shapes 32 into smaller, divided patterns 42. Cross-sections in orthogonal directions 4B-4B and 4C-4C of the structure resulting from further etching of the nitride 32 are shown in FIGS. 4B and 4C, respectively. The cross-section shown in FIG. 1 is taken along lines parallel to portions of both of these section lines 4B-4B and 4C-4C as shown by angled section line 1-1 and the intersection of the lines parallel to those section lines corresponds to the dashed line 15 of FIG. 1.

Several techniques are known that are capable of forming the trench as illustrated in FIG. 1. However, such known techniques are complex, present process criticalities and provide insufficient control over critical dimensions or line edge roughness as alluded to above and thus compromise the uniformity of fin geometry. In particular, rounding and narrowing of the ends of fins in plan view has been regularly observed using such techniques. Reduction of the dimensions of the ends of fins beyond the channel region is relatively critical since the source and drain regions of the finFET are formed in those locations and reduction of cross-sectional area should be avoided since drive current and short channel effects may be degraded. The channel region could also be undesirably widened or narrowed, depending on the process, as will be discussed below, and such dimensional changes will affect the electrical characteristics of a finFET formed from such a fin. As alluded to above, avoidance of compromise of short channel effects (SCE) as transistors are scaled to smaller sizes is a principal purpose of finFET design configurations.

Figure 5A:
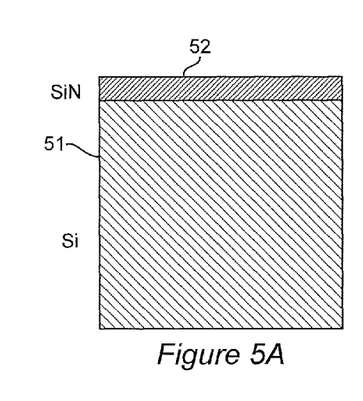
FIGS. 5A, 5B, 5C, 5D, 5E and 5F are a sequence of cross-sectional view of a portion of an integrated circuit including finFETs to illustrate a technique of fin formation that does not guarantee uniform geometry of fins.
Figure 5B:
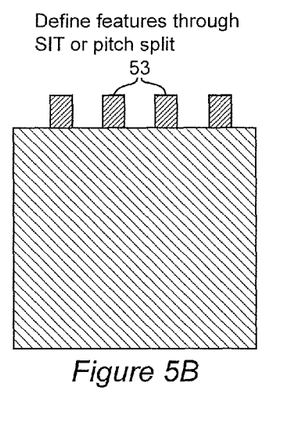
Figure 5C:
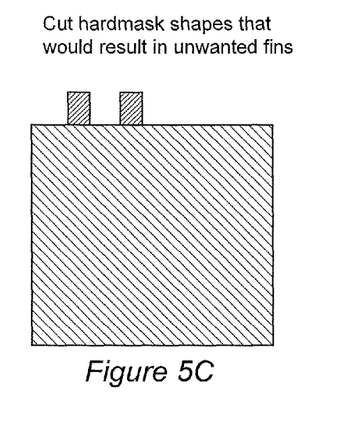
Figure 5D:
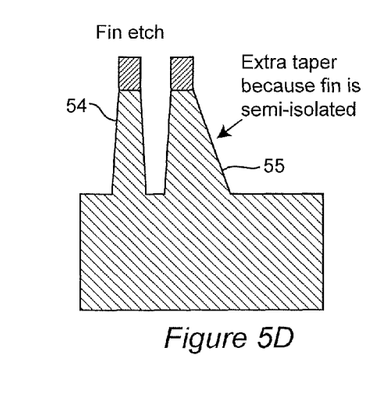
Figure 5E:
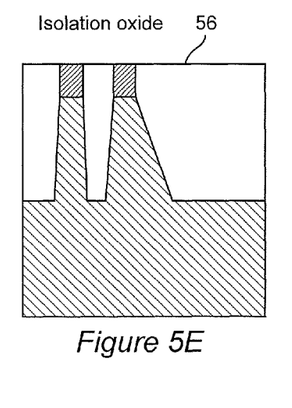
Figure 5F:
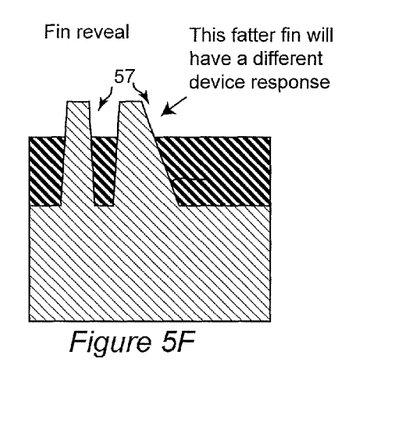

As an example of such processes, reference is now made to FIGS. 5A-5F which illustrate a sequence of cross-sectional views in a process for forming two fins. As shown in FIG. 5A, the process begins with a silicon layer or substrate 51 covered with a layer of nitride 52. The nitride layer is then patterned by SIT, split-pitch or other foreseeable processes to form a hard mask 53 that will become the nitride caps of fins. Then, as shown in FIG. 5C, the hard mask is cut by etching to remove the hard mask pattern where fins are not desired. The silicon is then etched in accordance with the hard mask 53 to form fins 54 and 55. However, because of the removal of portions of the hard mask as shown in FIG. 5C, fin 55 is relatively more isolated and thus will be formed with a different taper and is thicker than fin 54. (The fin adjacent to a trench has a larger open area on one side and is thus exposed to more sidewall passivation, causing the taper.) Isolation oxide is then deposited as shown in FIG. 5E and then etched back to remove the nitride caps 53 and expose the upper portions of the fins such that gate stacks can be applied thereover; limiting the channels substantially to the upper portions of the fins while the isolation material/oxide extends to a far greater depth. Although only the top portion of the fin functions as a finFET and the lateral dimensions of the channels will only be slightly different, since the difference in taper extends over the entire height of the fin the electrical characteristics of finFETs formed from fins 54 and 55 will differ significantly since there will be locations in the channel region of fin 55 that are more remote from the gate structure and are thus less well-controlled, as alluded to above.

Figure 6A:
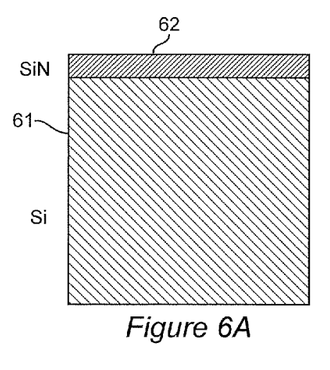
FIGS. 6A, 6B, 6C, 6D and 6E are a sequence of cross-sectional view of a portion of an integrated circuit including finFETs to illustrate a technique of fin formation that guarantees uniform geometry of fins and with which the invention is preferably implemented.
Figure 6B:
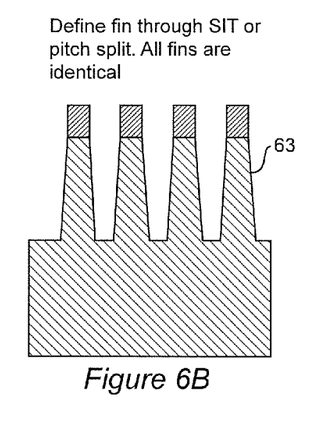
Figure 6C:
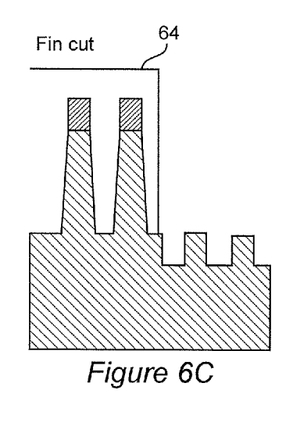

Referring now to FIG. 6A-6E, to avoid compromise of uniformity of fin geometry, a process flow to which the invention is particularly applicable will now be discussed. It should be appreciated that the invention preserves the advantages of this process in regard to uniformity of fin geometry and electrical properties. As with the process of FIGS. 5A-5F, this process starts with a layer or substrate of silicon 61 covered with a layer of silicon nitride 62. The silicon nitride is patterned and etching is performed to form the fins 63 as shown in FIG. 6B. Since the fins are equally proximate to each other, the sides of the fins are equally tapered, as is desirable. Then, as shown in FIG. 6C, a block-out mask 64 is applied and patterned for removal of unwanted fins, sometimes referred to as cutting.

It should be noted that the locations of the raised portions of the trench bottom may correspond to either the cut fins or the regios between them, depending on how the etch is performed. During the lithography step, the fins will be planarized with OPL. If a partial OPL recess process is then performed so that only the tops of the fins are exposed, a subsequent silicon etch may recess the fins below the original overetch. However, if a full OPL etch is performed, the original recess will recess further. Therefore, either trench bottom profile can be obtained and FIG. 6E should be understood as generic to and representing either alternative.

Figure 6D:
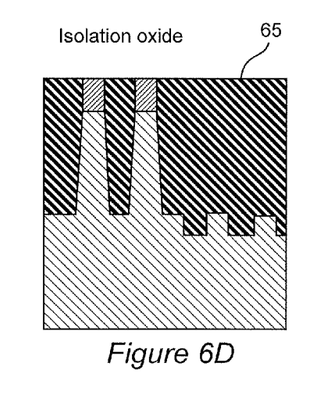
Figure 6E:
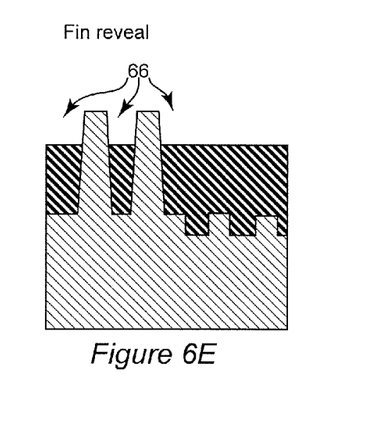

Isolation oxide 65 is then deposited and planarized as shown in FIG. 6d and etched back to remove the nitride caps and reveal the upper portions of the fins as shown at 66 of FIG. 6E. In comparison with FIGS. 5A-5B the geometry of all fins is substantially identical and no significant variation of electrical characteristics will be caused. This quality is preserved by the invention.

Figure 6F:
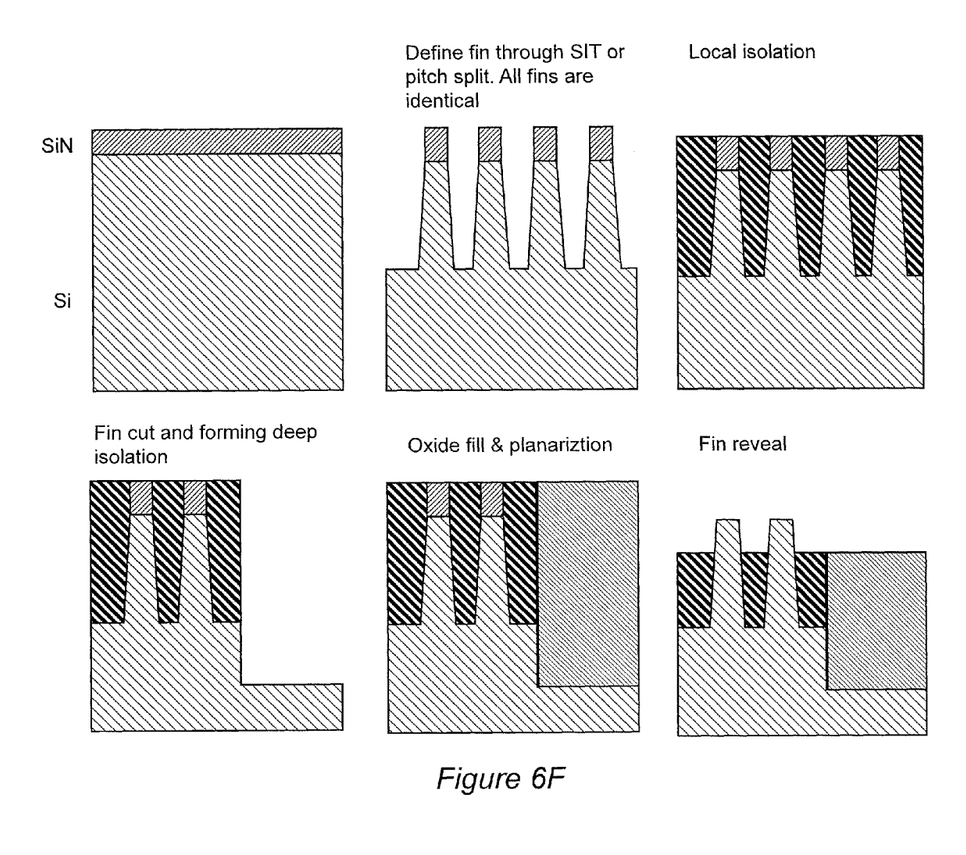
FIG. 6F illustrates a sequence of cross-sectional views illustrating a generalization of the process of FIGS. 6A-6E, FIGS. 7 and 8 illustrate a sequence of cross-sectional views illustrating an etching process flow that causes problems avoided by the invention.

The process depicted in FIGS. 5A-5F is referred to as a "cut first" process while the process depicted in FIGS. 6A-6E is referred to as a "cut last" process. Cut last processes are more generally illustrated in the sequence of cross-sectional views shown in FIG. 6F to which the description of FIGS. 6A-6E equally applies. It will be understood by those skilled in the art that many variations of the generalized process of FIG. 6F are possible but some present potential problems that will now be discussed.

Figure 2B:
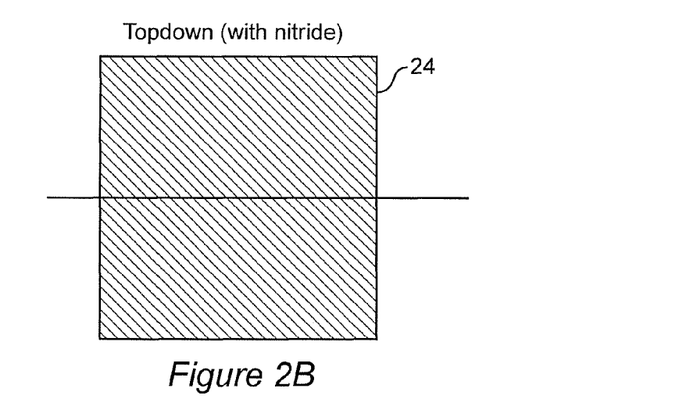
Figure 2C:
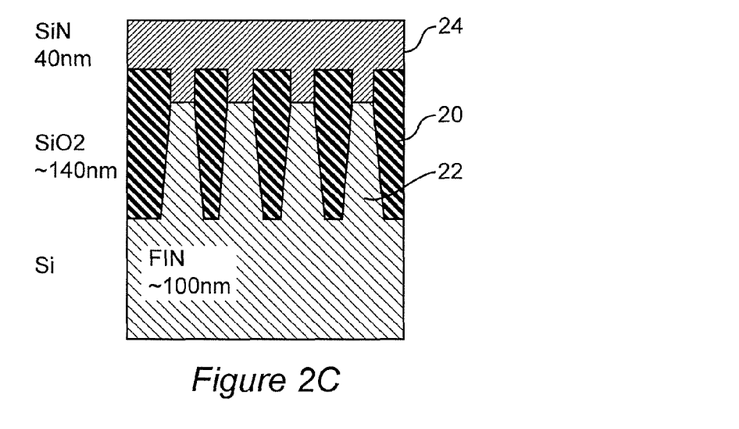
Figure 7:
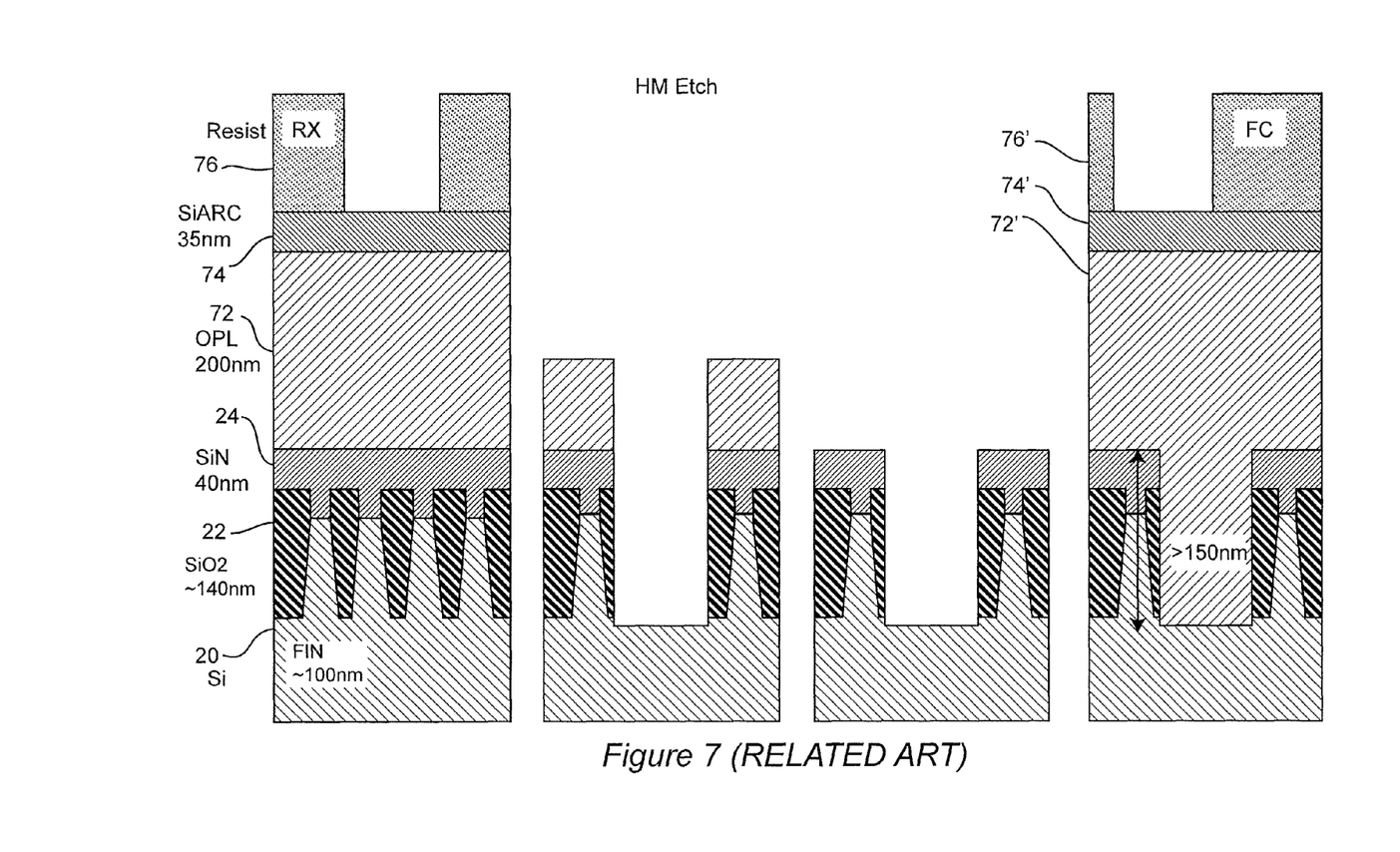
Figure 8:
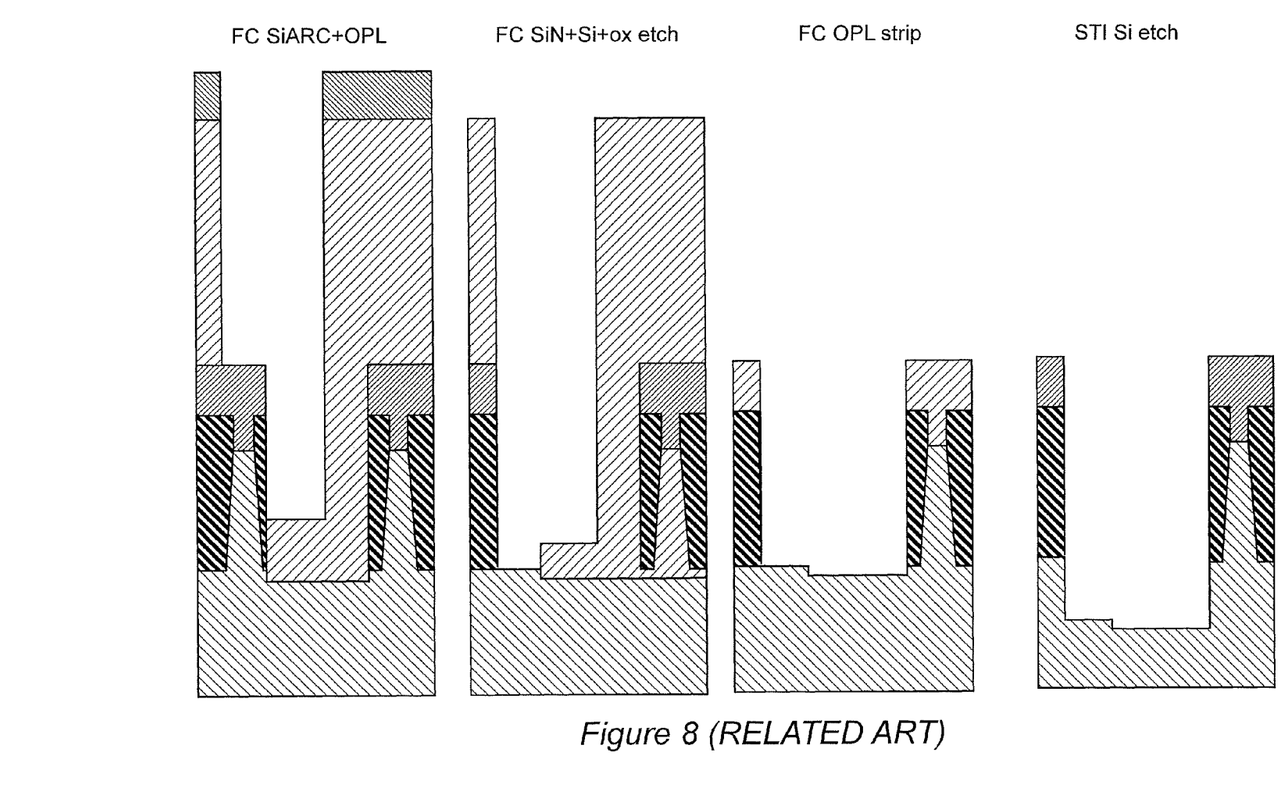

Referring now to FIGS. 7 and 8, a known (but not admitted to be prior art as to the present invention) technique of achieving the result illustrated in FIG. 1 will now be discussed. FIGS. 7 and 8 illustrate a sequence of cross-sectional views, proceeding left to right through both Figures, in order, of performing the two lithography (L) and etch (E) processes involved in forming a trench for an isolation structure. In the first cross-sectional view, the structure as shown in FIGS. 2B and 2C is shown with a thick OPL layer 72, Si-ARC layer 74 and a patterned resist 76 applied thereto. Using the patterned resist, a first patterning of the hard mask (HM) corresponding to the process shown in FIGS. 3A and 3B is performed followed by a non-selective but highly anisotropic etch to the level of silicon between two fins. This etch generally removes the ARC layer and a large portion of the OPL layer resulting in the structure shown in the second cross-sectional view. Then, as shown in the third cross-sectional view, the remainder of the OPL layer is removed preferably by a dry strip process similar to a dry etch, generally referred to as an "ash" process. A wet strip can also be used. Then, as shown in the fourth cross-sectional view of FIG. 7, a new OPL layer 72', new Si-ARC layer 74' and a new resist layer 76' are applied. It should be appreciated that this structure is similar to that of the first cross-sectional view of FIG. 7 but the pattern in the resist covers a different area including additional fin portions as discussed above in connection with FIG. 4A.

Then, as shown in the first cross-section of FIG. 8, the negative shape is etched into the ARC and OPL layer using a selective etch which etches only the organic material. Note that this selective etch removes the resist but does not reach the level of the silicon/semiconductor and does not attack either the nitride or oxide which protects the silicon/semiconductor fin. At this point, a non-selective etch of the nitride, oxide and silicon/semiconductor fin (but which is selective to the OPL material) is performed as shown in the second cross-sectional view of FIG. 8. The remaining OPL material is then removed as selectively as possible to other exposed materials. However, the selectivity of OPL materials to nitride is not optimal and, at this point, has been performed twice; the second time for a period of time likely to be longer than the first since OPL material is being removed from a deep trench as shown in the third cross-section of FIG. 8. Therefore, the removal of the OPL material and, to a lesser extent, processes associated with multiple applications of OPL material cause significant and substantial erosion of the nitride caps. The further selective etch of the trench into silicon/semiconductor as shown in the fourth and last cross-section of FIG. 8 can be performed but, as alluded to above, is also not optimally selective to the nitride cap which has already suffered some erosion and additional erosion will occur in the course of the final silicon etch.

A further challenge in the process illustrated in FIGS. 7 and 8 is illustrated in the final cross-sectional view of FIG. 7. Specifically, the second and/or third cross-section of FIG. 7 shows inclusion of large steps in the surface which must be planarized. The process for achieving good planarity is not trivial since the width of these steps can vary widely, depending on the integrated circuit design or layout and may result in greater material removal in some regions of the chip than others; causing variation from true planarity. Such variations, in turn, may compromise pattern fidelity of the second resist pattern since the surface of the resist may not be planar to match the plane of best focus for the second lithography exposure; requiring a significant depth of field window to achieve acceptable focus.

Referring now to FIGS. 9-12, the process flow in accordance with the invention that avoids the problems discussed above in connection with FIGS. 7 and 8 will now be discussed. As with FIGS. 7 and 8, FIGS. 9 and 10 illustrate a sequence of cross-sectional views proceeding from left to right through the Figures. The first or left-most cross-sectional view is identical to the corresponding cross-sectional view of FIG. 7 and the description thereof need not be repeated. Again, the Si-ARC and OPL layers (94, 92) are etched in accordance with the patterned resist layer 96. However, it is preferred to perform this etch initially with an etchant that is selective to nitride such that the etch stops at the nitride layer 26 and then to continue the etch of the nitride with an etchant for nitride that is selective to the silicon/semiconductor material and oxide such that only a shallow recess is formed by removal of the nitride. Again, the Si-ARC layer 94 and a fraction of the OPL layer is removed by this etch; resulting in a structure having a cross-section as shown in the second cross-sectional view. The remainder of the OPL layer is then stripped as shown in the third cross-sectional view of FIG. 9.

Figure 9:
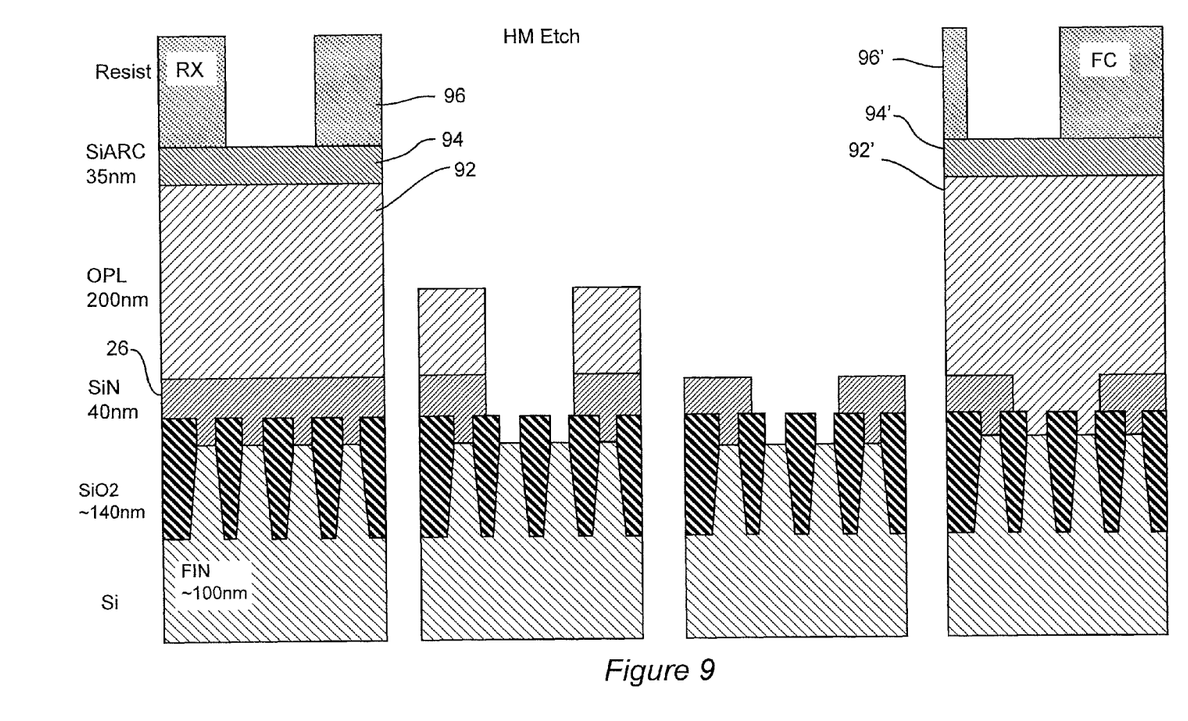
FIGS. 9 and 10 illustrate a sequence of cross-sectional view of the process flow in accordance with the invention.
Figure 10:
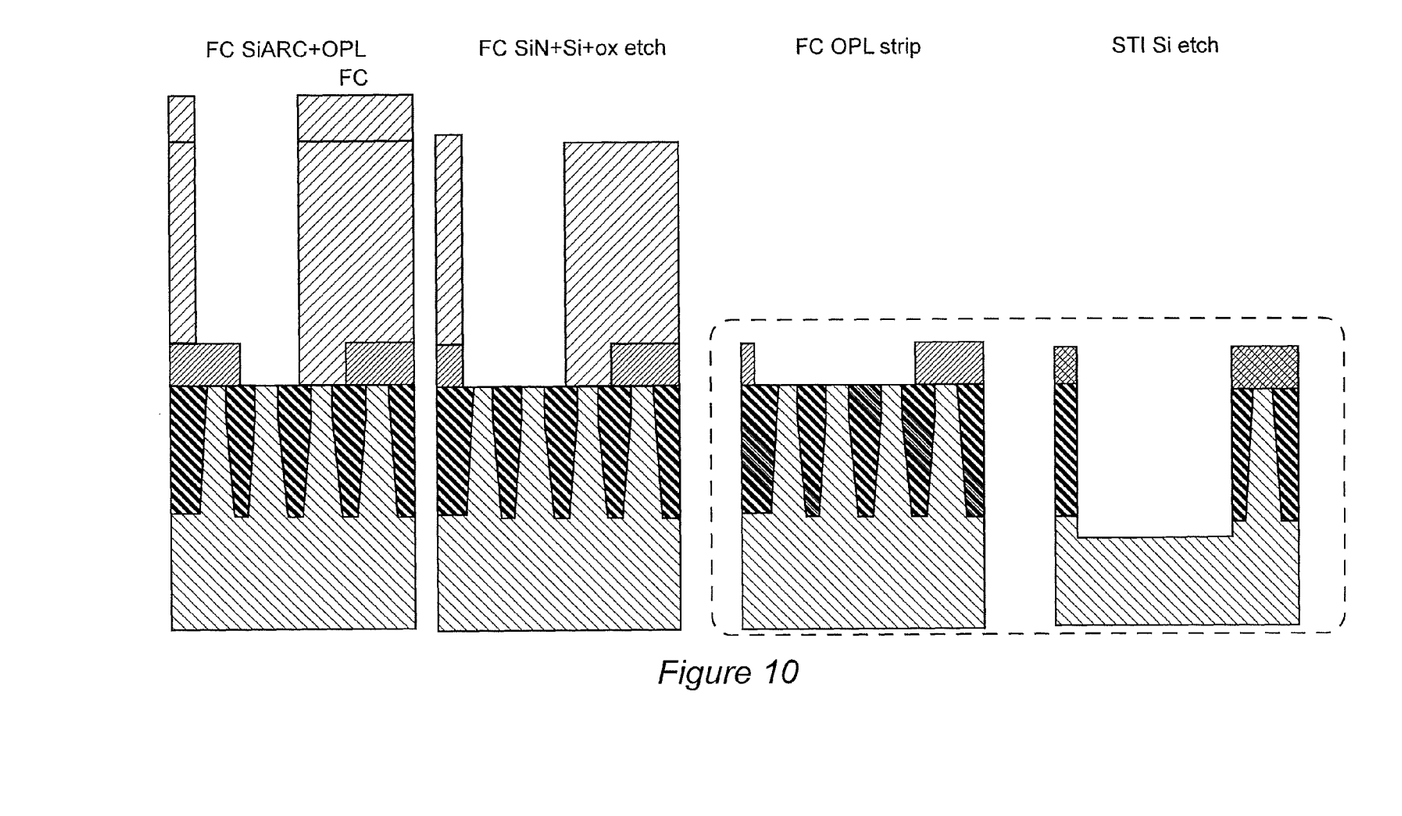

Then, as shown in the fourth cross-sectional view of FIG. 9, the OPL layer 92' and the Si-ARC layer 94' are replaced and covered with another resist layer 96' which is patterned differently from the pattern used for the first etch. It should be noted, however, that the OPL material extends only into a shallow recess due to the previous removal of only the material from the nitride hard mask layer 26 leaving the silicon/semiconductor fins and the local oxide isolation in place. Therefore, later removal of the OPL layer is less of a concern since it can be removed from a shallow recess much more easily and quickly that such a material can be removed from a deep trench; resulting in much reduced erosion of the remaining nitride. The step height is also much reduced compared with FIG. 7 as discussed above which increases the lithographic process window due to decreased variation in OPL thickness and improved planarity and focus window.

The Si-ARC layer 94' and OPL layer 92' can then be etched. Again, this etch is preferably performed with an etchant which is selective to nitride, oxide and silicon/semiconductor; leaving those materials substantially intact as shown in the first cross-sectional view of FIG. 10. The resist and ARC layers can then be removed and the nitride etch performed selectively to oxide and silicon/semiconductor as shown in the second cross-sectional view of FIG. 10, completing the nitride hard mask pattern. The remaining portion of the OPL layer can then be removed as shown in the third cross-sectional view of FIG. 10. It will be recognized that the third and fourth cross sectional views are substantively the same as the description of the problem in removing excess fins and local isolation oxide to form a recess in which an isolation structure can be formed as shown in FIG. 1 and described above.

Figure 11:
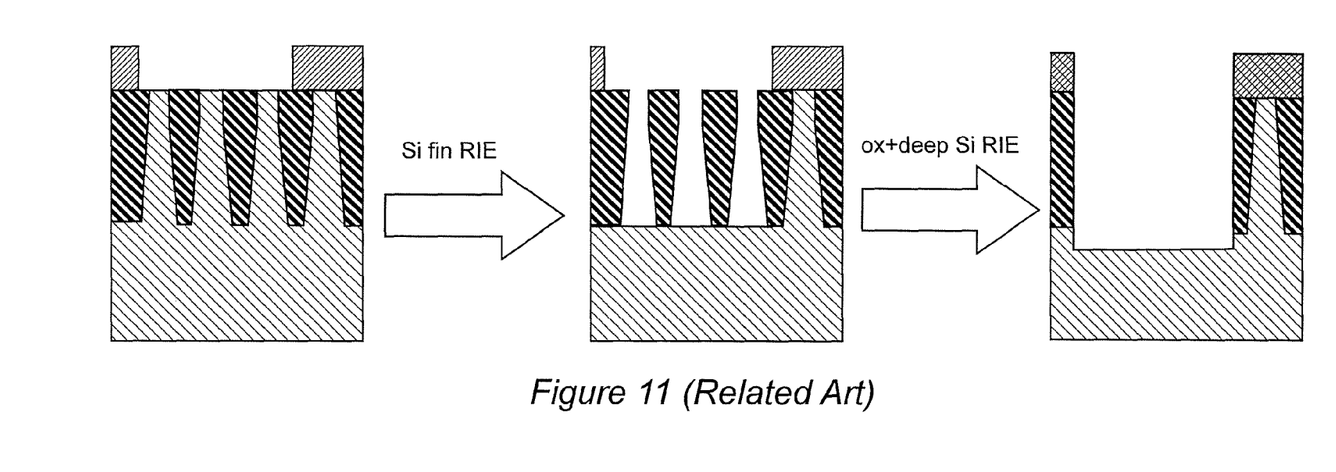
FIG. 11 illustrates an additional potential problem in the process flow of FIGS. 8 and 10 avoided by the invention.

Referring now to FIG. 11, it is seen that the region to be etched comprises essentially interleaved thin volumes of silicon/semiconductor and oxide local isolation with nitride caps on fins that are intended to remain. Processes for etching silicon/semiconductor selectively to oxide and nitride are known. Similarly, processes for etching oxide selectively to silicon/semiconductor and nitride are also known. For example, in the preferred application to silicon and silicon oxide, an $HBr/O_2/Ar$ or $HBr/CF_4/O_2/Ar$ RIE etch is preferred for selective etch of silicon and a fluorocarbon etch chemistry containing $C_4F_8$ and/or $C_4F_6$ is preferred for etching silicon oxide. However, selectivity of these etching processes is not optimal and substantial erosion of the nitride has been observed if these processes are employed sequentially and each performed to completion since the etching processes become slower as material is being removed at a greater depth within a narrow trench. This slowing of the etching process is principally due to dilution or loading of the etchant by removed material within the very small volume near the reaction interface, sometimes referred to as RIE lag. Further, particularly if the tapered silicon/semiconductor fins are removed first (further slowing the process due to greater fin volume to be removed at the bottom of the trench), leaving reverse-tapered oxide standing on a base that is narrower than at the top, the remaining high-aspect ratio oxide having reduced mechanical stability can break and fall over; complicating their removal by etching and usually resulting in a defect that reduces manufacturing yield.

Figure 12:
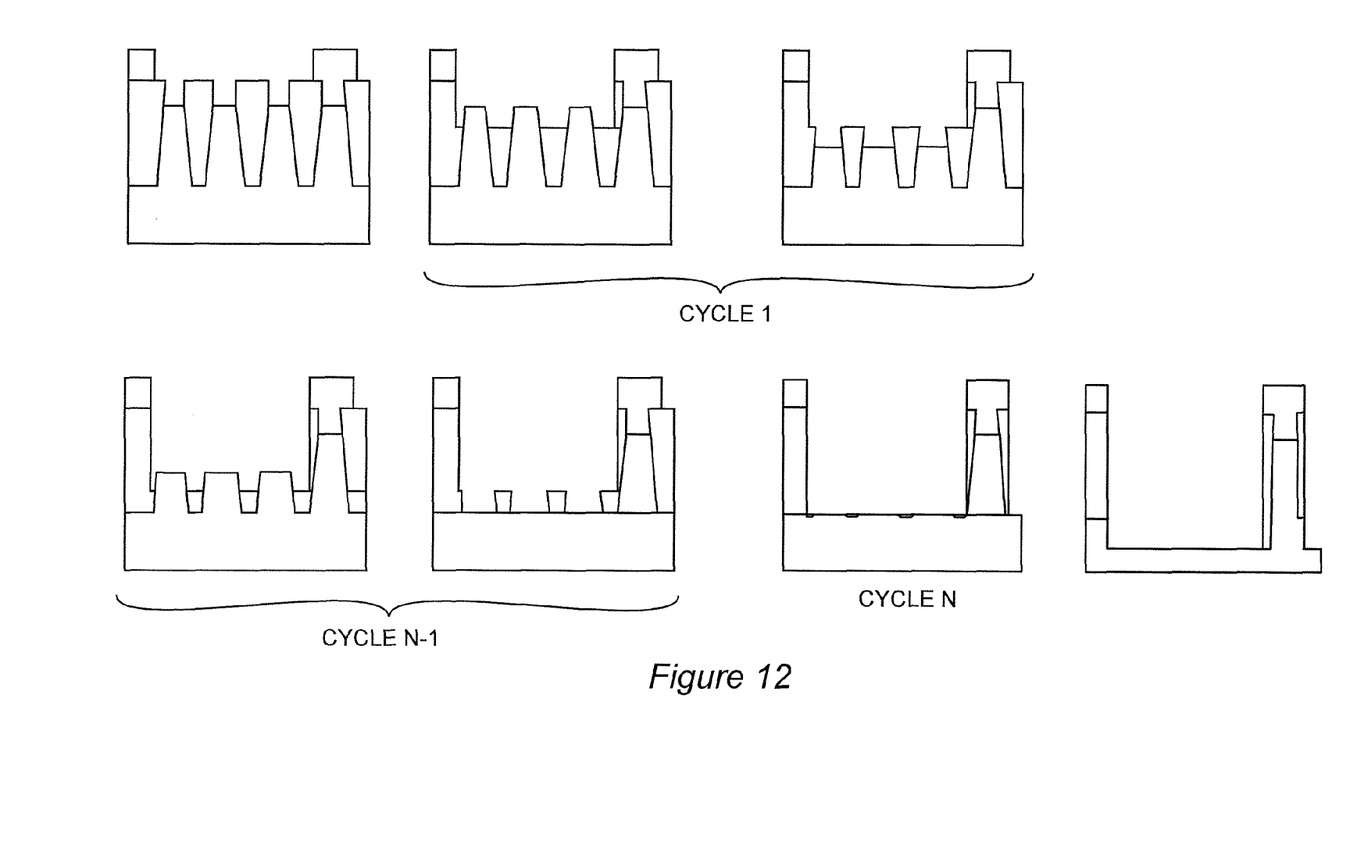
FIG. 12 is a detailed process flow in accordance with the invention that avoids the problem illustrated in FIG. 11.

Referring now to FIG. 12, the solution to these problems provided by the invention will now be explained. FIG. 12 illustrates a sequence of cross-sectional view proceeding from left to right and top to bottom throughout the Figure. The first cross-sectional view is identical to the cross-sectional view of FIG. 1. Essentially, the etching process in accordance with the invention is a cyclic etch using a known or foreseeable etchant chemistry for etching silicon/semiconductor selective to oxide and nitride for short periods of time alternating with an etchant chemistry for etching oxide selectively to silicon/semiconductor and nitride for short periods of time. A reactive ion etch is preferred for both processes. This can be achieved simply by switching etchant gases back and forth while continuing the application of RF power to maintain ionization of the etchant gas. However, it is possible that the etch may go through some uncontrolled phases as the gases are switched. Depending on the etching chemistries chosen, it may be preferable to purge the reaction vessel with argon or another inert gas or the like between etching processes but generally the etching processes may proceed concurrently for a short period as the etchants are alternating substituted for each other.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

If the tops of the fins and the local isolation oxide are coplanar, it is irrelevant whether the fin or the oxide is etched first. However, if they are not coplanar, it is preferable to begin the cyclic etching in accordance with the invention with the material having a protruding top surface rather than the material having a recessed surface. The reason for this preference is simply that, protruding features always etch faster because of the preferential etch yield of cornered surfaces, as is well-recognized in the art. Also, as alluded to above, both of these etching processes should be slightly isotropic although it is preferred that at least the process for etching oxide should be principally anisotropic to leave protective oxide on the sides of fins that are to remain below the nitride caps. To the extent that the process for etching is isotropic, the etchant can attack all sides of the protruding surface to speed the etching process. Each of the respective etching processes is continued only long enough to cause the other material to similarly protrude. Each process should be terminated and the etching process for the other material should be initiated prior to the material currently being etched becoming recessed sufficiently for the etching process to be more than negligibly slowed by RIE lag, the effect of dilution or loading of the etchant by the removed material. Thus by choice of the durations of the respective selective etches, a substantially 1:1 ratio of both material removal and selectivity between silicon/semiconductor and oxide in the etched feature with minimal nitride loss. In general, the duration of each cycle of the etching process by each of the alternating gas etchants should be on the order of ten to twenty seconds although the etch rate can be increased by increase of RF power and/or gas flow or pressure, as is generally desirable for practice of the invention.

Specifically and with reference to FIG. 12, the oxide is shown as protruding above the tops of the fins which have been preferably recessed, as alluded to above and, therefore, is preferably etched first. This etch process is continued until the oxide is recessed to a similar degree below the tops of the fins as shown in the second cross-sectional view of FIG. 12. The process for etching the oxide is then stopped and the process for etching the silicon/semiconductor of the fins is initiated. This process is terminated when the fins have been recessed to the point that the oxide again protrudes and before the etching process is slowed by etchant loading/RIE lag, as shown in the third cross-sectional view of FIG. 12. This completes the first cycle of the cyclic etch in accordance with the invention and leaves a surface topologically similar to the first cross-sectional view of FIG. 12, but having the entire surface recessed into the wafer or silicon layer from which the fins are formed.

The process is continued with further cycles of alternative material etching as depicted in the fourth and fifth cross-sectional views of FIG. 12. It is preferred, in this regard that the final cycle or the final silicon/semiconductor etch process (cycle N−1) be terminated at the level of the base of the oxide and leave only oxide deposits on the bottom of the trench as shown in the fifth cross-sectional view of FIG. 12 such that when they are removed (e.g. by a further or final etch of oxide selectively to semiconductor material and nitride), that a substantially planar silicon/semiconductor surface is produced as shown in the sixth cross-sectional view of FIG. 12. Doing so allows the trench for an isolation structure to be completed by a final silicon/semiconductor etch to further recess the trench into the silicon/semiconductor material to a desired degree.

The finFETs can then be completed by partially depositing the isolation structure to the bottom of the protective oxide remaining on the sides of the remaining fins, removing the protective oxide, forming a gate dielectric and electrode structure (e.g. a gate stack) on the remaining fins performing any desired doping and/or silicidation of the ends of the fins to form low resistance source and drain regions and/or extension implants and completing the isolation structure by completion of filling of the trench and making electrical connections as desired to the finFETs.

It should be appreciated that while the overall cyclic etch process in accordance with the invention may require a somewhat longer overall time to complete, the time required remains quite comparable to the process discussed above in connection with FIG. 6F, 7-8 or 11 and the total of the silicon/semiconductor and oxide etch time can be significantly reduced by providing for all material removal to be carried out as rapidly as possible by the fact that the etching processes are never allowed to be slowed by etchant loading and are accelerated in regard to material protruding above the surface of the other material. That is, the only additional time required by the cyclic etch process in accordance with the invention is the time, if any, required for switching between etching processes (e.g. to purge the reaction vessel, if necessary). Such a decrease in overall etching time allows erosion of the nitride to be held to 10% or less while the reaction interface or etch frontier remains substantially planar with only small protrusions of one material from the other and, by the same token, portions of each material are substantially supported by portions of the other material substantially over their full height and the problems noted in the process discussed above in connection with FIG. 11 are completely eliminated. Further, by holding erosion of the nitride caps to 10% or less, alteration of fin geometry and electrical characteristics is substantially precluded.

In view of the foregoing, it is seen that the cyclic selective etch of the present invention is applicable to any technique for forming fins of finFETs and the uniformity of fin geometry and electrical characteristics is substantially preserved while problems such as that described above in connection with FIG. 11 and which can significantly reduce manufacturing yield are precluded while selectivity of the etching processes to nitride are significantly enhanced. The invention provides a more robust process tolerance window than other known processes and enables the use of a simplified set of masks for patterning the hard mask (sometimes referred to as a patterning stack) and potentially a simplified integration scheme. The invention provides for local isolation and well isolation structures to be separately formed while preventing the fin sidewall from being exposed to multiple OPL removal processes and thus minimizes loss of fin material to oxidation.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for forming a trench for an isolation structure from a structure including excess fins formed from a layer of semiconductor material with local isolation material deposited between said fins, said method comprising steps of
   depositing hard mask material over a portion of said local isolation material and selected ones of said fins,
   patterning said hard mask material, and
   cyclically etching said excess fins selectively to said hard mask material and said local isolation material alternately with etching said local isolation material selectively to said excess fins and said hard mask material in respective etching cycles of a plurality of etching cycles to form a trench between said selected ones of said fins while limiting height of protrusion of portions of said excess fins above portions of said local isolation material and limiting height of protrusion of portions of said local isolation material above said portions of said excess fins.

2. The method as recited in claim 1, further including a step of
   etching said semiconductor material beyond a base of a said fin in accordance with said hard mask.

3. The method as recited in claim 2, wherein said step of etching said semiconductor material in accordance with said hard mask provides a substantially planar surface of a bottom of said trench.

4. The method as recited in claim 3, wherein respective cycles of said cyclic etching are begun and terminated when one of said fins and said local isolation material protrudes above the other of said fins and said local isolation material by a predetermined distance.

5. The method as recited in claim 1, wherein respective cycles of said cyclic etching are begun and terminated when one of said fins and said local isolation material protrudes above the other of said fins and said local isolation material by a predetermined distance.

6. The method as recited in claim 1, further comprising a step of
   depositing isolation material in said trench.

7. The method as recited in claim 6, further including a step of
   etching said semiconductor material in accordance with said hard mask.

8. The method as recited in claim 7, wherein said step of etching said semiconductor material in accordance with said hard mask provides a substantially planar surface of a bottom of said trench.

9. The method as recited in claim 8, wherein respective cycles of said cyclic etching are begun and terminated when one of said fins and said local isolation material protrudes above the other of said fins and said local isolation material by a predetermined distance.

10. The method as recited in claim 1, wherein said fins are formed by a sidewall image transfer technique.

11. The method as recited in claim 1, wherein said fins are formed by a split pitch lithography technique.

* * * * *